(12) United States Patent
Lee et al.

(10) Patent No.: US 12,707,990 B2
(45) Date of Patent: Aug. 11, 2026

(54) SEMICONDUCTOR PACKAGE FILM AND MANUFACTURING METHOD THEREOF

(71) Applicant: Samsung Display Co., LTD., Yongin-si (KR)

(72) Inventors: Ji Ye Lee, Yongin-si (KR); Ho Suk Maeng, Yongin-si (KR); Soo Yeon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 18/426,381

(22) Filed: Jan. 30, 2024

(65) Prior Publication Data

US 2025/0029903 A1 Jan. 23, 2025

(30) Foreign Application Priority Data

Jul. 18, 2023 (KR) ........................ 10-2023-0093333

(51) Int. Cl.

*H05K 1/02* (2006.01)
*H05K 1/11* (2006.01)
(Continued)

(52) U.S. Cl.

CPC ........ *H10W 70/453* (2026.01); *H05K 1/0271* (2013.01); *H05K 1/0284* (2013.01); *H05K 1/115* (2013.01); *H10W 70/047* (2026.01)

(58) Field of Classification Search

CPC .... H05K 1/0271; H05K 1/0284; H05K 1/115; H05K 1/189; H05K 2201/2009;
(Continued)

(56) References Cited

U.S. PATENT DOCUMENTS 6,320,135 B1 11/2001 Saito
6,919,513 B2 7/2005 Chung et al.
(Continued)

FOREIGN PATENT DOCUMENTS

JP 2003-224167 8/2003
JP 2008004855 A * 1/2008
(Continued)

OTHER PUBLICATIONS

English Machine Translation and Original JP2008004855 provided with Office Action (Year: 2008).*
(Continued)

*Primary Examiner* — Roshn K Varghese
(74) *Attorney, Agent, or Firm* — Lerner David LLP

(57) ABSTRACT

A semiconductor package film includes a base film having sprocket holes arranged in a first direction in an edge area at a periphery of a main area. The edge area is adjacent to the main area in a second direction intersecting the first direction. The semiconductor package film includes a circuit line disposed in the main area, and a support member disposed on the base film, the support member being adjacent to the sprocket holes in the edge area. The support member includes a support extending in the first direction, and protective walls connected to the support. The protective walls are spaced apart from each other with the sprocket holes disposed between the protective walls.

10 Claims, 9 Drawing Sheets

(51) Int. Cl.
*H10W 70/04* (2026.01)
*H10W 70/40* (2026.01)

(58) Field of Classification Search
CPC .......... H05K 2201/09063; H05K 2201/10681; H01L 23/49572; H01L 23/4985; H01L 23/49565; H01L 23/49579; H01L 23/562; H01L 21/4839; H01L 24/50; H10W 70/438
See application file for complete search history.

(56) References Cited

U.S. PATENT DOCUMENTS

| | | | | |
|---|---|---|---|---|
| 9,480,152 | B2 | 10/2016 | Hong et al. | |
| 2006/0054349 | A1* | 3/2006 | Iguchi | H01L 23/49572 174/255 |
| 2007/0042166 | A1 | 2/2007 | Chung et al. | |
| 2009/0011186 | A1* | 1/2009 | Yeh | H05K 3/0097 428/137 |

FOREIGN PATENT DOCUMENTS

| | | |
|---|---|---|
| KR | 10-2000-0057894 | 9/2000 |
| KR | 10-2002-0077173 | 10/2002 |
| KR | 10-0524088 | 10/2005 |
| KR | 10-2007-0022472 | 2/2007 |
| KR | 10-1148099 | 5/2012 |

OTHER PUBLICATIONS

International Search Report for International Application No. PCT/KR2024/009213, dated Oct. 10, 2024.

* cited by examiner

130: 131, 132,133, 134

SEMICONDUCTOR PACKAGE FILM AND MANUFACTURING METHOD THEREOF

CROSS-REFERENCE TO RELATED APPLICATION

The application claims priority to and benefits of Korean patent application No. 10-2023-0093333 under 35 U.S.C. § 119 (a), filed on the Jul. 18, 2023, in Korean Intellectual Property Office (KIPO), the entire disclosure of which is incorporated herein by reference.

BACKGROUND

1. Technical Field

The disclosure generally relates to a semiconductor package film, and more particularly, to a semiconductor package film and a manufacturing method thereof.

2. Description of the Related Art

Recently, with the development of the industry of flat panel display devices such as Liquid Crystal Displays (LCDs), Thin Film Transistor LCDs (TFT LCDs) for computers, and Plasma Display Panels (PDPs) for home use, the manufacturing industry of tape packages as drive IC components has also been developed. These tape packages require a line pattern having a thinner line width as the flat panel display devices become light in weight and thin in thickness. The tape package is a semiconductor package using a tape substrate, and may be divided into a Tape Carrier Package (TCP) and a Chip On Film (COF) package. The TCP has a structure in which a semiconductor chip is mounted on an inner lead exposed to a window of a tape substrate, using an Inner Lead Bonding (ILB) method. The COF package has a structure in which a semiconductor chip is mounted on a tape substrate having no window, using a flip chip bonding method.

A manufacturing process of the tape package is performed while the tape substrate moves reel to reel, and the movement of the tape substrate is made through sprocket holes formed at a certain distance in edge areas at both sides of the tape substrate. The tape substrate moves in a state in which a predetermined tensile force acts, and portions at which the sprocket holes are formed are relatively weak to stress. Hence, a defect may occur, in which the tape substrate is distorted or torn due to deformation of the sprocket holes.

The above information disclosed in this Related Art section is only for enhancement of understanding of the background of the disclosure and therefore it may contain information that does not form the prior art that is already known in this country to a person of ordinary skill in the art.

SUMMARY

Embodiments provide a semiconductor package film relatively strong against stress from the outside and a manufacturing method of the semiconductor package film. For example, although a relatively high tensile force acts on the semiconductor package film in case that the semiconductor package film is transferred by a pin roller, deformation of sprocket holes and/or peripheral area thereof does not exist or can be minimized.

The technical objectives to be achieved by the disclosure are not limited to those described herein, and other technical objectives that are not mentioned herein would be clearly understood by a person skilled in the art from the description of the disclosure.

In accordance with an aspect of the disclosure, there is provided a semiconductor package film including a base film having sprocket holes arranged in a first direction in an edge area at the periphery of a main area, the edge area being adjacent to the main area in a second direction intersecting the first direction; a circuit line disposed in the main area; and a support member disposed on the base film, the support member being adjacent to the sprocket holes in the edge area, wherein the support member includes a support extending in the first direction; and protective walls connected to the support, and the protective walls are disposed to be spaced apart from each other with the sprocket holes disposed between the protective walls. The main area may be used for mounting of a semiconductor element.

The protective walls may be arranged in the first direction, and each of the protective walls may extend in the second direction from the support.

The sprocket holes may be disposed between the support and the main area.

Each of the sprocket holes may be partially surrounded by two protective walls among the protective walls and a portion of the support.

A width between protective walls adjacent to each other among the protective walls in the first direction may be greater than a width of one of the sprocket holes in the first direction.

The semiconductor package film may further include a reinforcing film attached to a lower surface of the base film. The sprocket holes may penetrate the base film and the reinforcing film.

The reinforcing film may include a synthetic resin material.

The support and the protective wall may include copper.

In accordance with another aspect of the disclosure, there is provided a semiconductor package film having first and second edge areas and a main area which is disposed between the first and second edge areas, the semiconductor package film including a base film having first sprocket holes arranged in a first direction in the first edge area and second sprocket holes arranged in the first direction in the second edge area, the first and second edge areas being spaced apart from each other in a second direction intersecting the first direction; a first support member disposed on the base film, the first support member being adjacent to the first sprocket holes in the first edge area; and a second support member disposed on the base film, the second support member being adjacent to the second sprocket holes in the second edge area, wherein the first support member includes a first support extending in the first direction and first protective walls connected to the first support, the first protective walls being spaced apart from each other with the first sprocket holes disposed between the first protective walls, and the second support member includes a second support extending in the first direction and second protective walls connected to the second support, the second protective walls being spaced apart from each other with the second sprocket holes disposed between the second protective walls.

A width between protective walls adjacent to each other among the protective walls in the first direction may be substantially equal to a width of one of the sprocket holes in the first direction.

In accordance with still another aspect of the disclosure, there is provided a method of manufacturing a semiconductor package film, the method including forming a multi-layer structure including a base film and a copper layer, the multi-layer structure including a main area and an edge area adjacent to the main area in a first direction; forming sprocket holes arranged in a second direction intersecting the first direction in the edge area; forming a photoresist pattern on the copper layer; and forming a support member by removing at least part of the copper layer, using the photoresist pattern, wherein the support member includes a support extending in the second direction; and protective walls connected to the support, and the protective walls are spaced apart from each other with the sprocket holes disposed between the protective walls.

The protective walls may be arranged in the second direction, and each of the protective walls may extend in the first direction from the support.

The sprocket holes may be disposed between the support and the main area.

Each of the sprocket holes may be partially surrounded by two protective walls among the protective walls and a portion of the support.

A width between protective walls adjacent to each other among the protective wall in the second direction may be greater than a width of one of the sprocket holes in the second direction.

The method may further include attaching a reinforcing film to a lower surface of the base film. The sprocket holes may penetrate the base film and the reinforcing film.

The reinforcing film may include a synthetic resin material.

The support and the protective walls may include copper.

The forming of the support member may include wet-etching the copper layer using photoresist patterns as a mask.

The support member may protect the sprocket holes and the semiconductor package film from external stress.

The method may further include attaching a reinforcing film to a lower surface of the base film.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be more thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
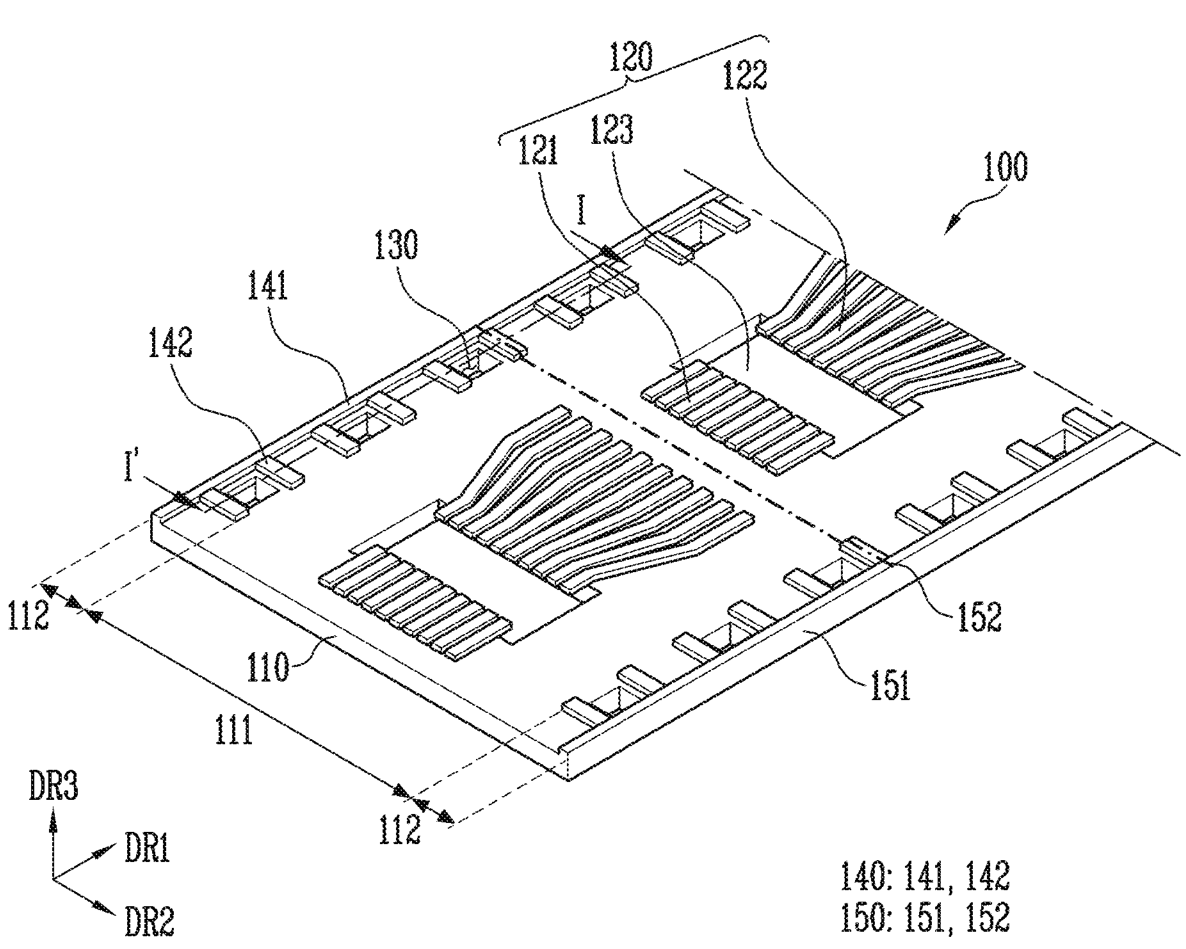
FIG. 1 is a schematic perspective view illustrating a semiconductor package film in accordance with an embodiment of the disclosure.

Hereinafter, embodiments of the disclosure will be described in more detail with reference to the accompanying drawings. In the description below, only a necessary part to understand an operation according to the disclosure is described and the descriptions of other parts are omitted in order not to unnecessarily obscure subject matters of the disclosure. In addition, the disclosure is not limited to embodiments described herein, but may be embodied in various different forms. Rather, embodiments described herein are provided to describe the disclosed contents and to sufficiently transfer the ideas of the disclosure to a person of ordinary skill in the art.

In the entire specification, when an element is referred to as being "connected" or "coupled" to another element, it can be directly connected or coupled to the another element or be indirectly connected or coupled to the another element with one or more intervening elements interposed therebetween. The technical terms used herein are used only for the purpose of illustrating a specific embodiment and not intended to limit the embodiment. It will be understood that when a component "includes" an element, unless there is another opposite description thereto, it should be understood that the component does not exclude another element but may further include another element. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Similarly, for the purposes of this disclosure, "at least one selected from the group consisting of X, Y, and Z" can be construed as X only, Y only, Z only, or any combination of two or more items X, Y, and Z (e.g., XYZ, XYY, YZ, ZZ).

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

Spatially relative terms, such as "below," "above," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the term, "above," may encompass both an orientation of above and below. The apparatus may be otherwise oriented (e.g., rotated 90 degrees or at other orientations) and the spatially relative descriptors used herein interpreted accordingly.

In addition, the embodiments of the disclosure are described here with reference to schematic diagrams of embodiments (and an intermediate structure) of the disclosure, so that changes in a shape as shown due to, for example, manufacturing technology and/or a tolerance may be expected. Therefore, the embodiments of the disclosure shall not be limited to the specific shapes of a region shown here, but include shape deviations caused by, for example, the manufacturing technology. The regions shown in the drawings are schematic in nature, and the shapes thereof do not represent the actual shapes of the regions of the device, and do not limit the scope of the disclosure.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view illustrating a semiconductor package film in accordance with an embodiment of the disclosure.

Referring to FIG. 1, the semiconductor package film 100 may include a base film 110, at least one circuit line 120 formed in a main area 111, a first support member 140, and/or a second support member 150.

The base film 110 may have a three-dimensional structure extending in a first direction DR1, a second direction DR2 intersecting the first direction DR1, and a third direction DR3 intersecting the first direction DR1 and the second direction DR2. For example, the base film 110 may have a shape such as a rectangular parallelepiped or a regular hexahedron.

A synthetic resin material such as polyimide (hereinafter, referred to as 'PI') may be mainly used as the material of the base film 110. A thickness of the base film 110 may be formed in a range of about 25 μm to about 50 μm, but the disclosure is not limited thereto.

The base film 110 may be divided into the main area 111 to be used for mounting of a semiconductor element and at least one edge area 112 adjacent to the main area 111 in the second direction DR2.

The circuit line 120 may include at least one input line 121, at least one output line 122, and a window 123.

The window 123 may correspond to an area on which a semiconductor chip can be mounted. With respect to the window 123, the input line 121 extending toward one side, and the output line 122 may extend toward another side. In embodiments, a number of the output lines 122 may be formed relatively greater than a number of the input lines 121. However, embodiments are not limited thereto.

The circuit line 120 may be formed with a thickness of about 8 μm, mainly using a conductor having high electrical conductivity, such as copper, but embodiments are not limited thereto. The circuit line 120 may be formed by performing processes, such as etching and patterning, on a copper layer (see 710 shown in FIG. 7) formed in the main area 111 of the base film 110.

The base film 110 may include sprocket holes 130. The sprocket holes 130 may be formed by performing penetration in the third direction on the base film 110, using a punching machine or the like.

The sprocket holes 130 may be located in the edge areas 112. The sprocket holes 130 may be spaced apart from each other at a constant distance in the first direction DR1. Although it is illustrated that the sprocket holes 130 have a rectangular shape, the disclosure is not limited thereto. For example, the sprocket holes 130 may have a circular shape or the like.

The sprocket holes 130 may be used for transfer of the semiconductor package film, using a pin roller (not shown). For example, pins of the pin roller may pass in the third direction DR3 through the sprocket holes 130. In addition, according to rotational movement of the pin roller, the semiconductor package film 100 may move (e.g., linearly move) in the first direction DR1 and the opposite direction of the first direction DR1. This will be described in more detail with reference to FIG. 13.

The first support member 140 and the second support member 150 may be located at the edge areas 112. The edge areas 112 may be spaced apart from each other in the second direction DR2 by a width of the main area 111.

The first support member 140 and the second support member 150 may partially surround the sprocket holes 130. For example, each of the sprocket holes 130 may have a quadrangular shape when viewed on a plane, and the other three sides except a side adjacent to the main area 111 among four sides of the quadrangular shape may be surrounded by any one of the first support member 140 and the second support member 150.

The first support member 140 and the second support member 150 may have a thickness of about 8 μm in the third direction DR3, but the disclosure is not limited thereto. Various materials may be used for forming the first support member 140 and the second support member 150. For example, copper may be used as the material of the first support member 140 and the second support member 150.

The first support member 140 may include a first support 141 and first protective wall 142. The first support 141 may extend in the first direction DR1, and the first protective walls 142 may extend in the second direction DR2 while being coupled (or connected) to the first support 141. A width of each of the sprocket holes 130 in the first direction DR1 may be smaller than a width between adjacent first protective walls among the first protective walls 142 in the first direction DR1. A width of each of the sprocket holes 130 in the second direction DR2 may be smaller than a width of one of the first protective walls 142 in the second direction DR2. Accordingly, the sprocket holes 130 may be spaced apart from the first support member 140 at a certain distance.

Similarly, the second support member 150 may include a second support 151 and second protective walls 152. The second support 151 may extend in the first direction DR1, and the second protective walls 152 may extend in the opposite direction of the second direction DR2 while being coupled to the second support 151. The width of each of the sprocket holes 130 in the first direction DR1 may be smaller than a width between adjacent second protective walls among the second protective walls 152 in the first direction DR1. The width of each of the sprocket holes 130 in the second direction DR2 may be smaller than a width of one of the second protective walls 152 in the second direction DR2. Accordingly, the sprocket holes 130 may be spaced apart from the second support 150 at a certain distance.

Figure 2:
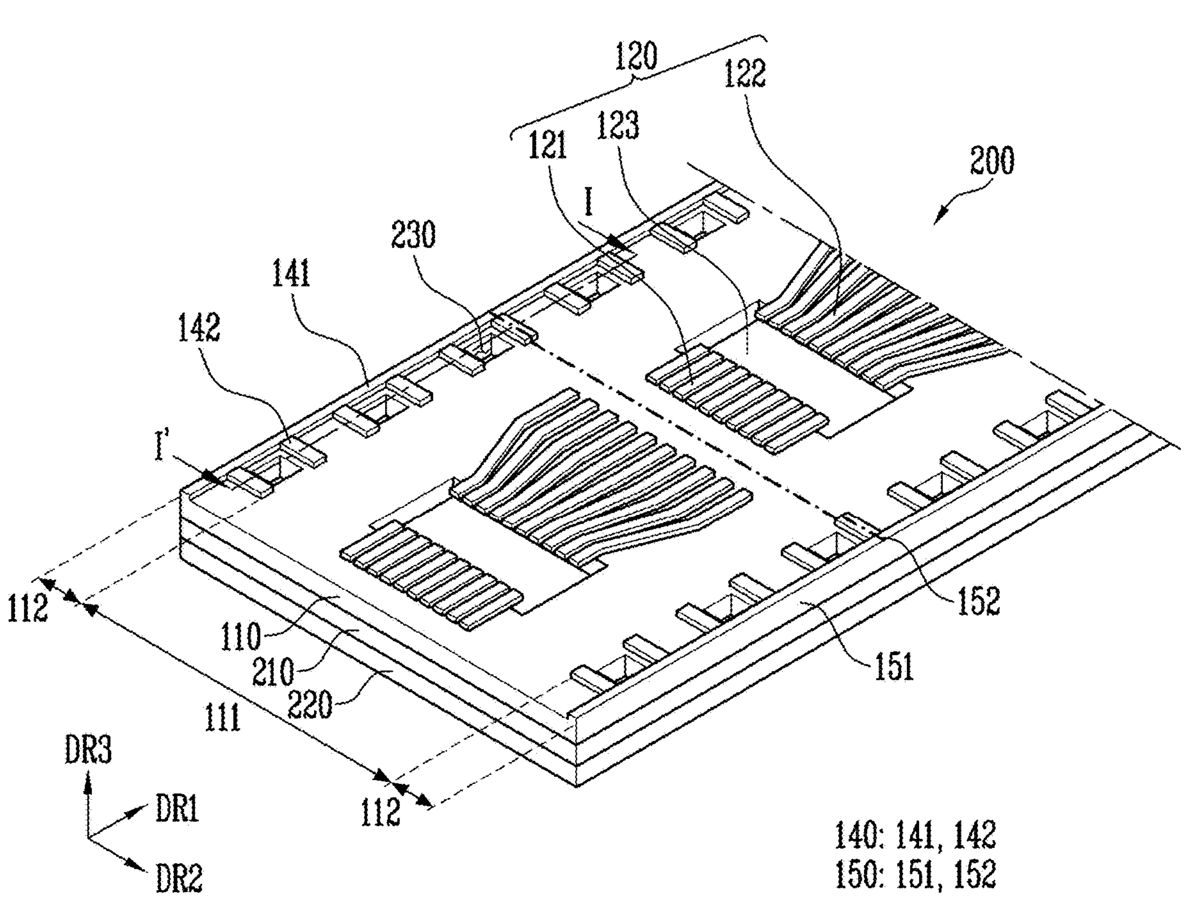
FIG. 2 is a schematic perspective view illustrating a semiconductor package film in accordance with another embodiment of the disclosure.

FIG. 2 is a schematic perspective view illustrating a semiconductor package film in accordance with another embodiment of the disclosure.

Referring to FIG. 2, the semiconductor package film 200 may include a base film 110, an adhesive layer 210, and a reinforcing film 220.

The base film 110 may be configured similar to the base film 110 shown in FIG. 1. Hereinafter, repetitive descriptions will be omitted.

The adhesive layer 210 adjacent to the base film 110 in the third direction DR3 may be additionally attached to the base film 110. The reinforcing film 220 adjacent to the adhesive layer 210 in the third direction DR3 may be further attached to the adhesive layer 210. Each of the adhesive layer 210 and the reinforcing film 220 may be understood to have a three-dimensional structure extending in the first direction DR1, the second direction DR2, and the third direction DR3.

Various materials may be used to form the adhesive layer 210. For example, an acrylic-based or epoxy-based adhesive may be used as the material of the adhesive layer 210. A synthetic resin material such as PET, LCP, PTFE, PP, PE, PA-66 or PC may be used as the material of the reinforcing film 220.

The adhesive layer 210 may have a thickness of about 5 μm to about 15 μm, and the reinforcing film 220 may have a thickness of about 50 μm. However, the disclosure is not limited thereto. As the thickness of the reinforcing film 220 becomes thicker, bending of the semiconductor package film 200 is prevented while the semiconductor package film 200 is manufactured, thereby being advantageous in manufacturing of the semiconductor package film 200.

Sprocket holes 230 may be formed by performing penetration on the base film 110, the adhesive layer 210, and the reinforcing film 220 in the third direction DR3, using a punching machine or the like. In other words, the sprocket holes 230 may be formed not only in the base film 110 but also in the adhesive layer 210 and the reinforcing film 220.

Figure 3:
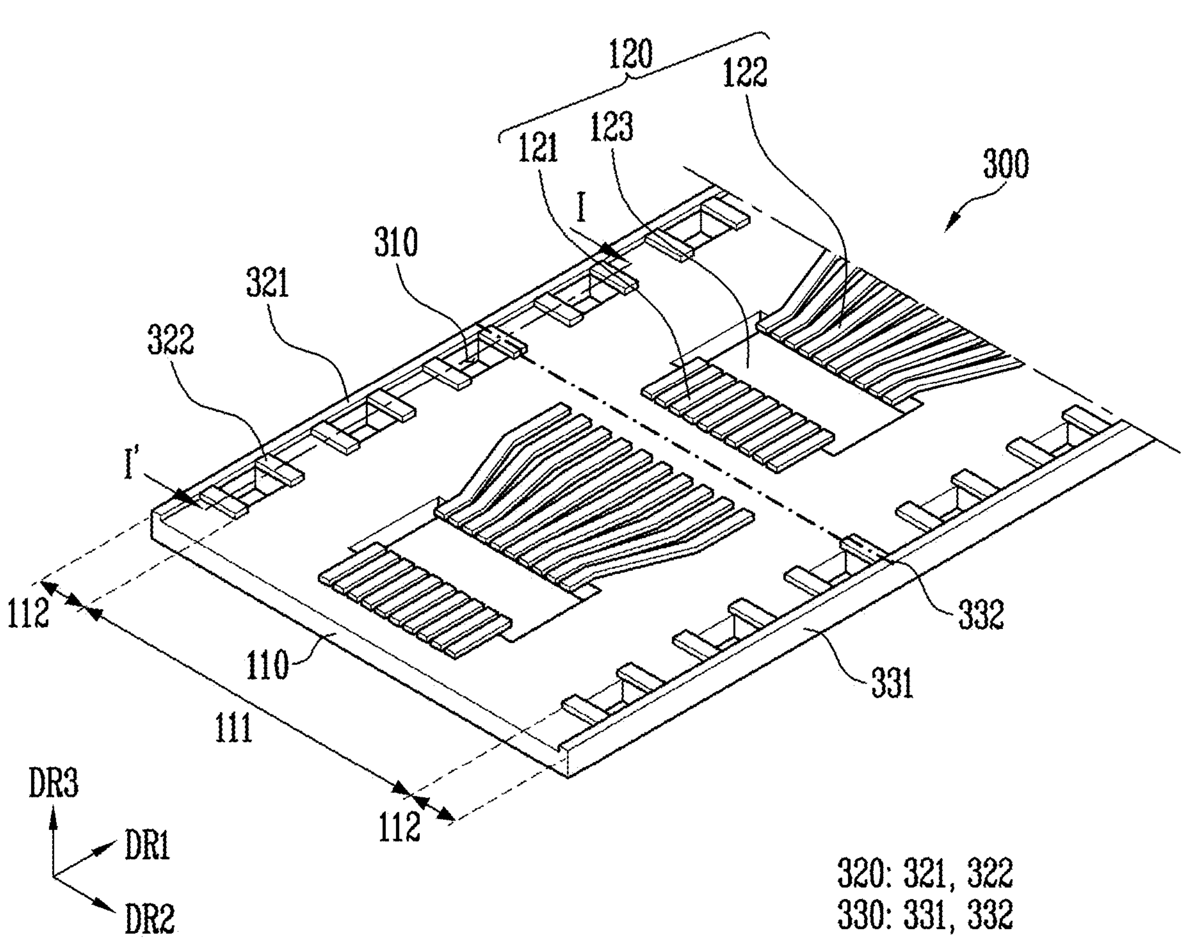
FIG. 3 is a schematic perspective view illustrating a semiconductor package film in accordance with still another embodiment of the disclosure.

FIG. 3 is a schematic perspective view illustrating a semiconductor package film in accordance with still another embodiment of the disclosure. The semiconductor package film 300 may be described similar to the semiconductor package film 100 shown in FIG. 1, except for sprocket holes 310, a first support member 320, and a second support member 330. Hereinafter, repetitive descriptions will be omitted.

Referring to FIG. 3, the first support member 320 may include a first support 321 and first protective walls 322. The first support 321 may extend in the first direction DR1, and the first protective walls 322 may extend in the second direction DR2 from the first support 321.

In embodiments, a width of each of the sprocket holes 310 in the first direction DR1 may be substantially equal to a width between adjacent first protective walls among the first protective walls 322 in the first direction DR1. A width of each of the sprocket holes 310 in the second direction DR2 may be equal to a length of one of the first protective walls 322 in the second direction DR2. Accordingly, three sides of each of the sprocket holes 310 may be surrounded by the first support member 320 while the sprocket holes 310 are not spaced apart from the first support member 320.

Similarly, the second support member 330 may include a second support 331 and second protective walls 322. The second support 331 may extend in the first direction DR1, and the second protective walls 332 may extend in the second direction DR2 from the second support 331. The width of each of the sprocket holes 310 in the first direction DR1 may be equal to a width between adjacent protective walls among the second protective walls 332 in the first direction DR1. The width of each of the sprocket holes 310 in the second direction DR2 may be equal to a length of one of the second protective walls 332 in the second direction DR2. Accordingly, three sides of each of the sprocket holes 310 may be surrounded by the second support member 330 while the sprocket holes 310 are not spaced part from the second support member 330.

Figure 4:
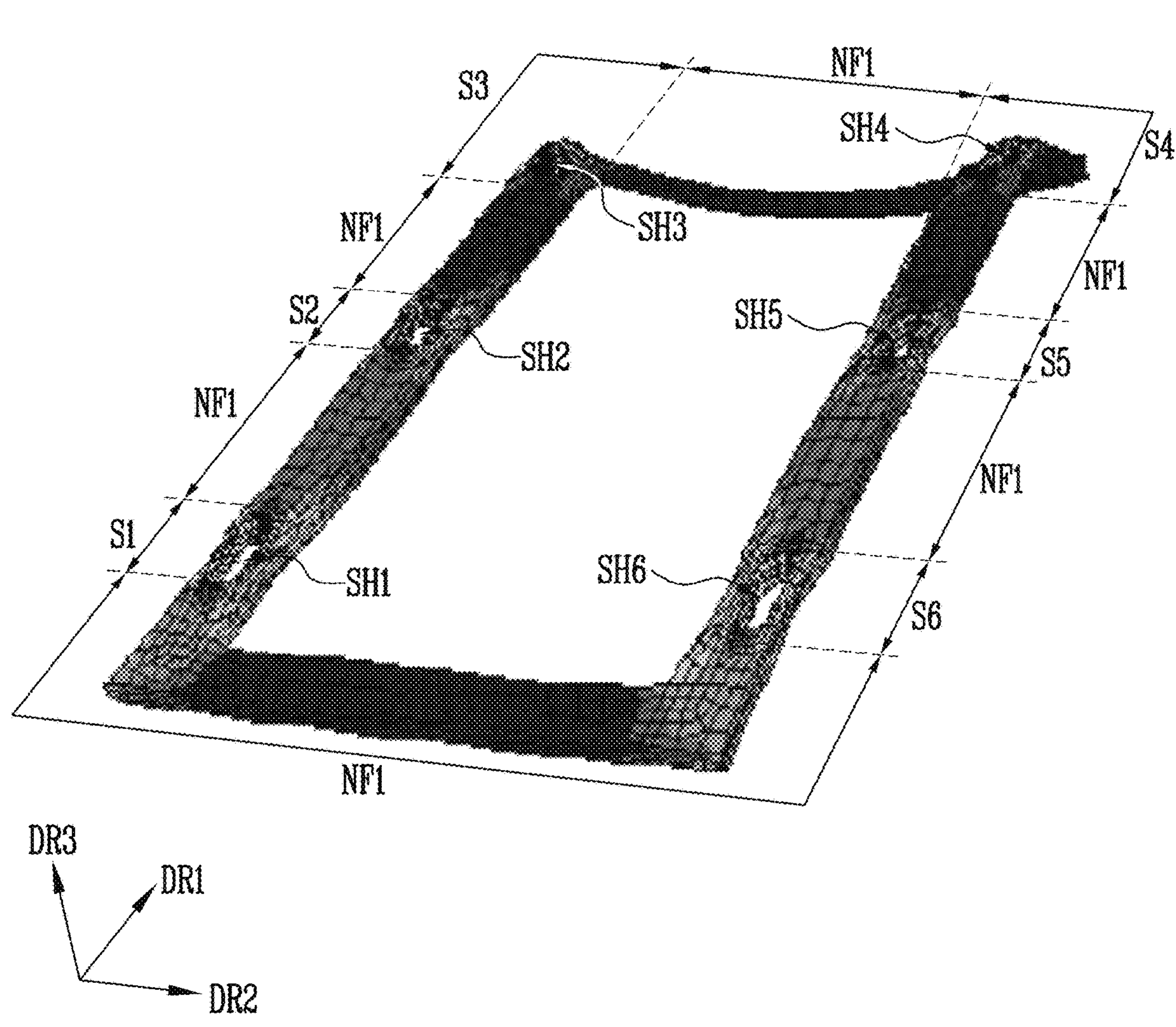
FIG. 4 is a schematic view illustrating an example of a shape in which a general semiconductor package film may be deformed in case that a force is applied to the semiconductor package film in transfer.

FIG. 4 is a schematic view illustrating an example of a shape in which a general semiconductor package film may be deformed in case that a force is applied to the semiconductor package film in transfer. A shape of the semiconductor package film according to a simulation result through a computer is illustrated in FIG. 4.

Referring to FIG. 4, six sprocket holes SH1 to SH6 and an edge area(s) S1 to S6 and NF1 of a base film 400 are illustrated.

The edge area(s) S1 to S6 and NF1 may include first to sixth sprocket areas S1 to S6 in the vicinity of first to sixth sprocket holes SH1 to SH6 and areas NF1 to which a force is not directly applied by a pin roller. The first to sixth sprocket areas S1 to S6 may correspond to areas to which the force is directly applied by the pin roller in transfer of the base film 400.

The first to sixth sprocket areas S1 to S6 may correspond to areas in the vicinity of the first to sixth sprocket holes SH1 to SH6, respectively. For example, the first sprocket area S1 may exist in the vicinity of the first sprocket hole SH1. The second sprocket area S2 may exist in the vicinity of the second sprocket hole SH2.

The shape of the base film 400 may not be deformed in the areas NF to which the force is not directly applied by the pin roller.

On the other hand, a tensile force may act with respect to the first to sixth sprocket holes SH1 to SH6 respectively in the first to sixth sprocket areas S1 to S6. For example, the tensile force may act in the first direction DR1 and the second direction DR2. In addition, it can be seen that shapes of the first to sixth sprocket areas S1 to S6 are considerably deformed due to the tensile force. For example, it can be seen that the first sprocket area S1 is sunk in the opposite direction of the third direction DR3 with respect to the first sprocket hole SH1, or even a portion of the first sprocket area S1 is drooped.

Due to deformation of the first to sixth sprocket holes SH1 to SH6, issues such as a film cutting miss problem may occur in a module line process. Accordingly, problems may occur, such as occurrence of loss corresponding to an amount of dumped base film and deterioration of the manufacturing yield of the semiconductor package film.

In order to prevent these problems, reinforcement of a tensile force in the vicinity of sprocket holes of semiconductor package films is made, but the use of an additional material (e.g., attachment of a new metal reinforcing layer) may accelerate the deterioration of the manufacturing yield. It is desirable to improve the productivity of the module line process by protecting the sprocket holes without any increase in additional material cost.

Figure 5:
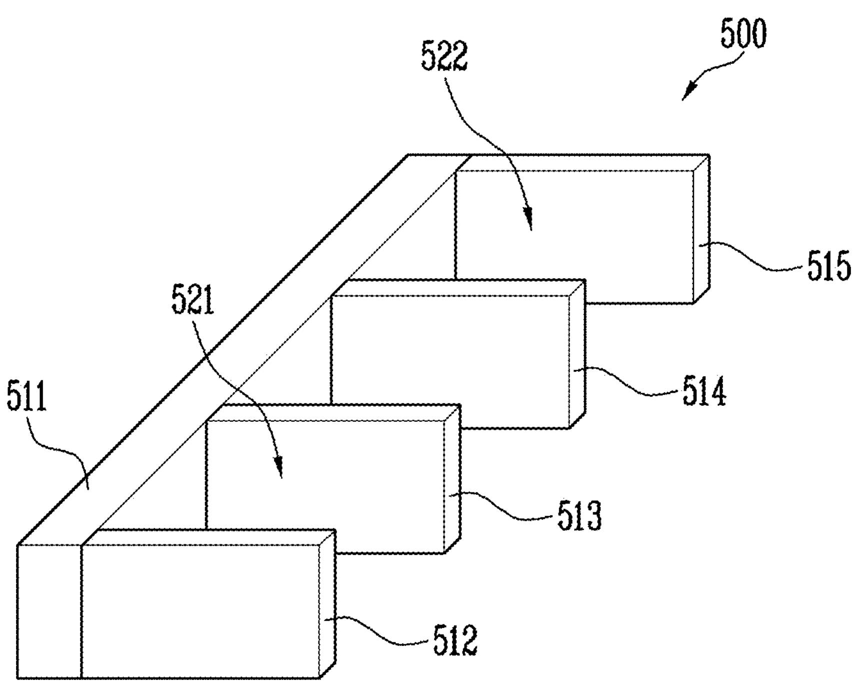
FIG. 5 is a schematic perspective view illustrating a support shown in FIG. 1 and protective walls corresponding thereto.
Figure 5:
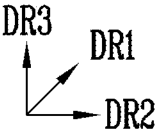

FIG. 5 is a schematic perspective view illustrating the support shown in FIG. 1 and the protective walls corresponding thereto. A support member 500 shown in FIG. 5 may be provided as at least one of the first support members 140 and 320 and the second support members 150 and 330, which are shown in FIGS. 1 to 3.

Referring to FIG. 5, the support member 500 may include a support 511 and first to fourth protective walls 512 to 515.

The support 511 may extend in the first direction DR1, and each of the first to fourth protective walls 512 to 515 may extend in the second direction DR2 while being connected to the support 511. The support 511 and the first to fourth protective walls 512 to 515 may have various shapes. The shapes of the support 511 and the first to fourth protective walls 512 to 515 are not limited to the shapes shown in FIG. 5.

The first to fourth protective walls 512 to 515 may be spaced apart from each other in the first direction DR1. In addition, an area in which a sprocket hole is to be located may exist between adjacent protective walls. For example, an area 521 in which a first sprocket hole is to be located may exist between the first protective wall 512 and the second protective wall 513, and an area 522 in which a second sprocket hole is to be located may exist between the third protective wall 514 and the fourth protective wall 515.

A pin roller may be located under the support member 500 in the third direction DR3 in case that the semiconductor package film 100 (see FIG. 1) is transferred in a module line process. In addition, pins of the pin roller may penetrate, in the third direction DR3, the areas 521 and 522 in which the first and second sprocket holes are to be located. After that, the pin roller may rotate with respect to a rotation axis extending in the second direction DR2. The semiconductor package film 100 (see FIG. 1) may be moved in the first direction DR1 or the opposite direction of the first direction DR1 according to the rotation of the pin roller. The support member 500 may reinforce the strength of the areas 521 and 522 in which the first and second sprocket holes are to be located. Accordingly, deformation of the first and second sprocket holes located in the areas 521 and 522 in which the first and second sprocket holes are to be located can be prevented.

Figure 6:
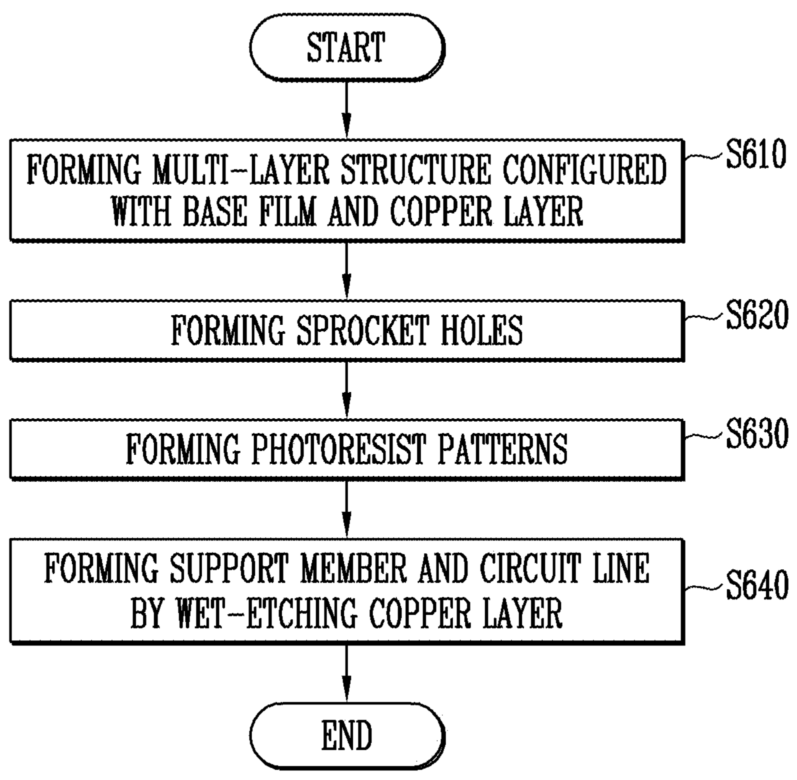
FIG. 6 is a flowchart illustrating an embodiment of a manufacturing method of the semiconductor package film shown in FIG. 1.

FIG. 6 is a flowchart illustrating an embodiment of a manufacturing method of the semiconductor package film shown in FIG. 1.

Referring to FIGS. 1 and 6, in S610, a multi-layer structure configured with a base film 110 and a copper layer 710 may be formed. It is noted that materials that form the copper layer 710 is not limited to copper and other various materials may be used.

Figure 8:
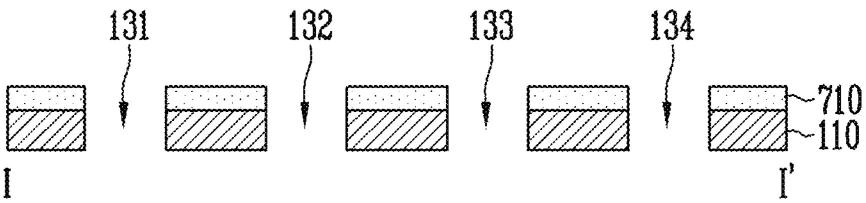
FIG. 8 is a schematic sectional view taken along line I-I' of the semiconductor package film in S620 shown in FIG. 6.
Figure 8:
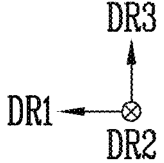

In S620, sprocket holes 131 to 134 (see FIG. 8) may be formed in edge areas 112 while penetrating the base film 110 (see FIG. 8) and the copper layer 710 (see FIG. 8).

Figure 9:
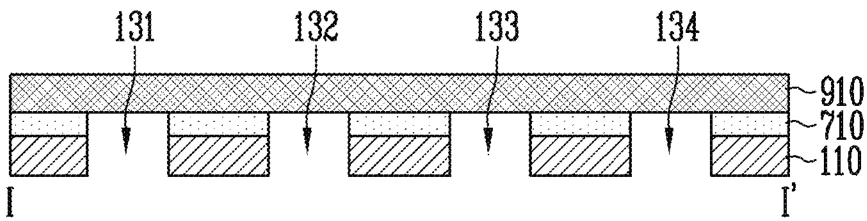
FIGS. 9 and 10 are schematic sectional views taken along line I-I' of the semiconductor package film in S630 shown in FIG. 6.
Figure 9:
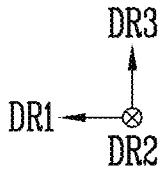

In S630, a photoresist layer 910 (see FIG. 9) may be formed on the top of the copper layer 710 (see FIG. 9). After that, patterning and light exposure may be simultaneously performed by irradiating a laser beam onto the photoresist layer 910, and photoresist patterns 911 to 918 (see FIG. 10) through development processing.

In S640, the copper layer 710 may be wet-etched using the photoresist patterns 911 to 918 (see FIG. 11) as a mask, thereby forming protective walls 711 to 718 (see FIG. 12), a support (not shown), and at least one circuit line (not shown). After that, the photoresist patterns may be removed.

As the copper layer 710 is etched, a first support member 140 and a second support member 150 may be formed in the edge areas 112. The first and second support members 140 and 150 may be disposed at the periphery of the sprocket holes 130. In a manufacturing process, the first and second support members 140 and 150 may protect the sprocket holes 130 and/or the semiconductor package film 100 from external stress (e.g., a tensile force).

Figure 7:
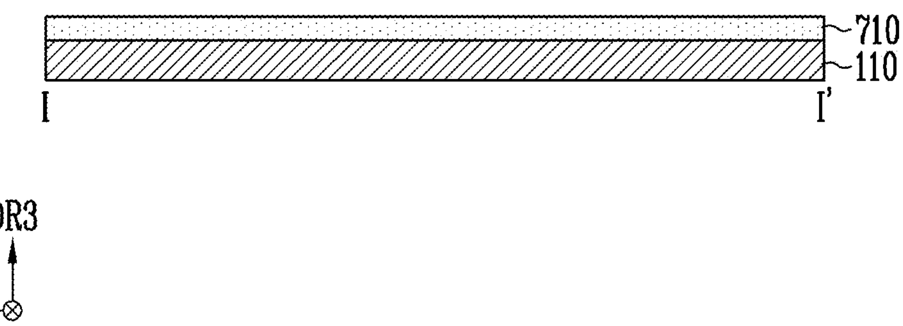
FIG. 7 is a schematic sectional view taken along line I-I' of the semiconductor package film in S610 shown in FIG. 6.

FIG. 7 is a schematic sectional view taken along line I-I' of the semiconductor package film in S610 shown in FIG. 6.

Referring to FIGS. 1 and 7, a copper layer 710 may be formed on a base film 110 to be in contact with the base film 110 in the third direction DR3.

The base film 110 and the copper layer 710 may have a three-dimensional shape extending in the first direction DR1, the second direction DR2, and the third direction DR3. A synthetic resin material such as polyimide resin, acrylic resin, polyether-nitrile resin, polyether-sulfone resin, polyethylene terephthalate resin, polyethylene naphthalate resin, or polyvinyl chloride resin may be used as the material of the base film 110.

A thickness of the base film 110 may be formed in a range of 25 μm to 50 μm, and a thickness of the copper layer 710 may be about 8 μm. However, embodiments are not limited thereto.

Although a multi-layer structure including the base film 110 and the copper layer 710 is provided, a multi-layer structure may be provided, which is formed by adhering a copper foil (or a foil) to the base film 110 with an adhesive layer (not shown) interposed therebetween.

In embodiments, an adhesive layer 210 (see FIG. 2) may be attached to a lower surface of the base film 110 to be adjacent to the base film 110 in the third direction DR3, and a reinforcing film 220 (see FIG. 2) may be attached to a lower surface of the adhesive layer 210 to be adjacent to the adhesive layer 210 in the third direction DR3.

FIG. 8 is a schematic sectional view taken along line I-I' of the semiconductor package film in S620 shown in FIG. 6.

Referring to FIGS. 1 and 8, penetrating may be performed in the third direction DR3 on the base film 110 and the copper layer 710, using various methods, such as a punching machine or the like, thereby forming sprocket holes 131 to 134.

The sprocket holes 131 to 134 may be arranged while being spaced apart from each other at a constant distance in the first direction DR1.

A pin roller may be located in the opposite direction of the third direction DR3 of the base film 110 in case that the semiconductor package film 100 is transferred in a module line process. In addition, pins of the pin roller may respectively penetrate the sprocket holes 131 to 134 in the third direction. After that, the base film 110 may be moved in the first direction DR1 or the opposite direction of the first direction DR1 according to rotation of the pin roller with respect to a rotation axis extending in the second direction DR2.

Figure 10:
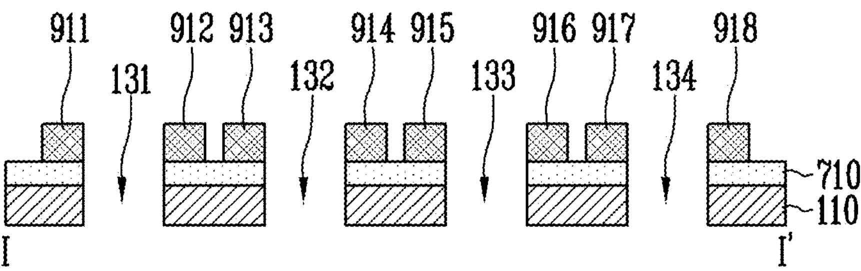
Figure 10:
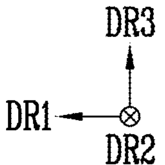

FIGS. 9 and 10 are schematic sectional views taken along line I-I' of the semiconductor package film in S630 shown in FIG. 6.

Referring to FIGS. 1 and 9, a photoresist layer 910 may be formed on the copper layer 710 to be adjacent to the copper layer 710 in the third direction DR3. The photoresist layer 910 may have a three-dimensional shape extending in the first direction DR1, the second direction DR2, and the third direction DR3. A thickness of the photoresist 910 may be about 4 μm, but the disclosure is not limited thereto.

Referring to FIGS. 1 and 10, patterning and light exposure may be simultaneously performed by irradiating a laser beam onto the photoresist layer 910 (see FIG. 9). After that, photoresist patterns 911 to 918 may be formed through development process. Various materials, such as Sodium carbonate ($Na_2CO_3$) or the like, may be used as a developer. A first support member 140 (see FIG. 1) and a second support member 150 (see FIG. 1) may be formed at portions of the copper layer 710, which overlap with the photoresist patterns 911 to 918.

Figure 11:
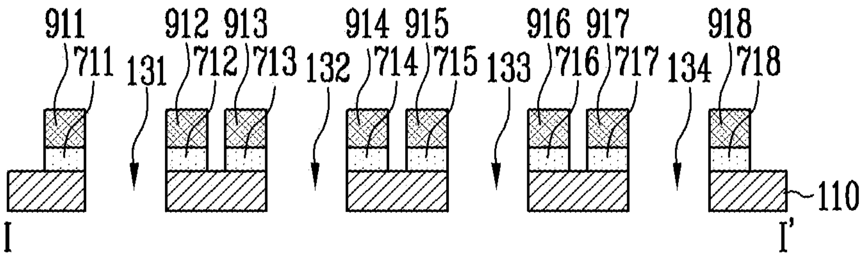
FIGS. 11 and 12 are schematic sectional views taken along line I-I' of the semiconductor package film in S640 shown in FIG. 6.
Figure 11:
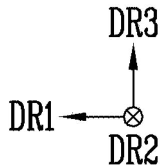
Figure 12:
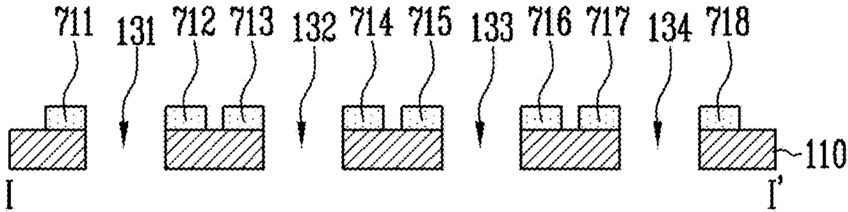
Figure 12:
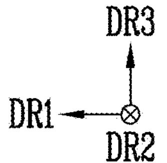

FIGS. 11 and 12 are schematic sectional views taken along line I-I' of the semiconductor package film in S640 shown in FIG. 6.

Referring to FIGS. 1 and 11, the copper layer 710 may be removed. In an embodiment, the copper layer 710 may be wet-etched using the photoresist patterns 911 to 918 as a mask. Through the wet etching, portions of the copper layer 710, which do not overlap the photoresist patterns 911 to 918, may be removed. Accordingly, the first and second support members 140 and 150 and circuit lines may be formed. Protective walls 711 to 718 are illustrated in FIG. 11.

In an embodiment, an etchant for etching a Cu element as a metal may be mainly used as an etching agent. In an example, an etchant using ferric chloride as a main element, an etchant using cupric chloride as a main element, a mixture of sulfuric acid and hydrogen peroxide, or the like may be used as the etching agent.

Referring to FIGS. 1 and 12, the photoresist patterns 911 to 918 (see FIG. 10) may be removed. Additionally, tin plating may be performed on the protective walls 711 to 718 and the support members (not shown). A tin plate layer generated through the tin plating may surround the first and second support members 140 and 150 including the protective walls 711 to 718 and the circuit lines.

In accordance with the embodiment of the disclosure, the first and second support members 140 and 150 can be formed by etching the copper layer 710 without using any additional material, so that the yield of the semiconductor package film 100 can be maintained while protecting the sprocket holes 131 to 134.

Figure 13:
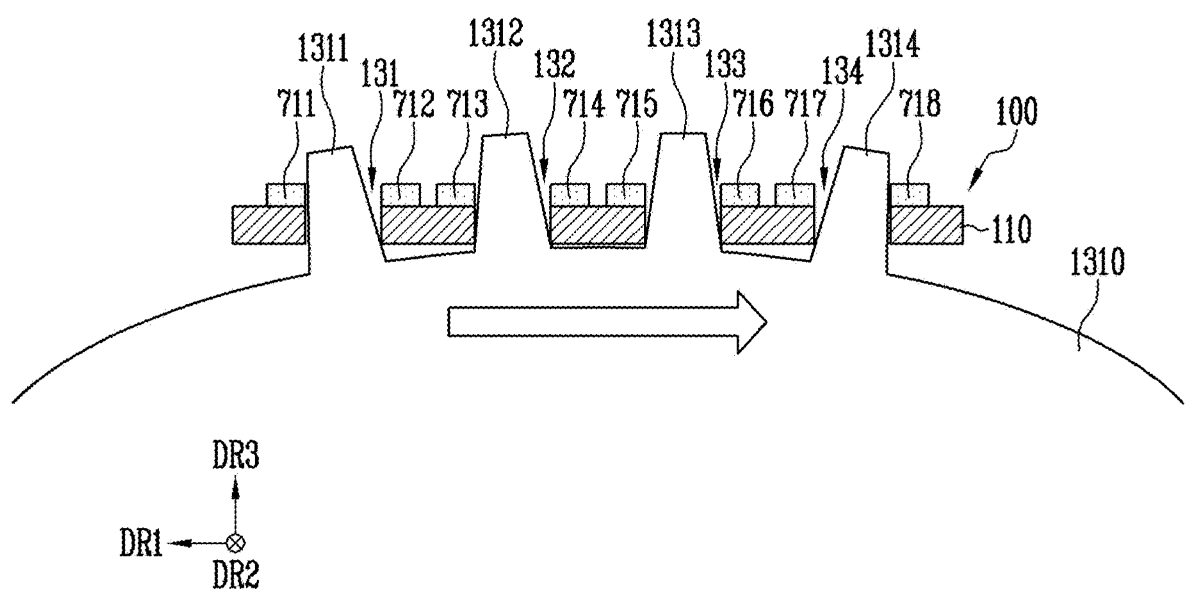
FIG. 13 is a schematic view illustrating a transfer process of the semiconductor package film.

FIG. 13 is a schematic view illustrating a transfer process of the semiconductor package film.

Referring to FIG. 13, a semiconductor package film 100 and a pin roller 1310 are illustrated.

The pin roller 1310 may include pins. For convenience of illustration, first to fourth pins 1311 to 1314 are illustrated in FIG. 13.

The first to fourth pins 1311 to 1314 may penetrate sprocket holes. For example, the first pin 1311 may penetrate a first sprocket hole 131, and the second pin 1312 may penetrate a second sprocket hole 132. The third pin 1313 may penetrate a third sprocket hole 133, and the fourth pin 1314 may penetrate a fourth sprocket hole 134.

After that, the pin roller 1310 may rotatably move in the first direction DR1 or the opposite direction of the first direction DR1 with respect to a rotation axis extending in the second direction DR2. Accordingly, the semiconductor package film 100 engaged with the first to fourth pins 1311 to 1314 through the first to fourth sprocket holes 131 to 134 may be moved. For example, the semiconductor package film 100 may be linearly moved in the first direction DR1 or the opposite direction of the first direction DR1. In the process in which the semiconductor package film 100 is moved, a tensile force may act in the vicinity of the first to fourth sprocket holes 131 to 134.

In case that first to eighth protective walls 711 to 718 and the support do not exist in the semiconductor package film 100, shapes of the first to fourth sprocket holes 131 to 134 may be deformed due to the tensile force.

On the other hand, in accordance with the embodiment of the disclosure, the first to eight protective walls 711 to 718 and the support exist in the semiconductor package film 100 (see FIG. 1), so that strength of the first to fourth sprocket holes 131 to 134 and portions adjacent thereto can be reinforced. For example, the first protective wall 711, the second protective wall 712, and the support exist, so that strength in the vicinity of the first sprocket hole 131. By virtue of the reinforced strength, deformation of the shapes of the first to fourth sprocket holes 131 to 134 can be prevented.

In accordance with the disclosure, there can be provided a semiconductor package film relatively strong against stress from the outside and a manufacturing method of the semiconductor package film.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A semiconductor package film comprising:

a base film having sprocket holes arranged in a first direction in an edge area at a periphery of a main area, the edge area being adjacent to the main area in a second direction intersecting the first direction;

a circuit line disposed in the main area; and a support member disposed on the base film, the support member being adjacent to the sprocket holes in the edge area, wherein the support member includes:

a support extending in the first direction; and protective walls connected to the support, the protective walls are spaced apart from each other with the sprocket holes disposed between the protective walls, and the support member does not surround edges of the sprocket holes adjacent to the main area.

2. The semiconductor package film of claim 1, wherein the protective walls are arranged in the first direction, and each of the protective walls extends in the second direction from the support.

3. The semiconductor package film of claim 2, wherein the sprocket holes are disposed between the support and the main area.

4. The semiconductor package film of claim 1, wherein each of the sprocket holes is partially surrounded by two protective walls among the protective walls and a portion of the support.

5. The semiconductor package film of claim 1, wherein a width between protective walls adjacent to each other among the protective walls in the first direction is greater than a width of one of the sprocket holes in the first direction.

6. The semiconductor package film of claim 1, further comprising:

a reinforcing film attached to a lower surface of the base film, wherein the sprocket holes penetrate the base film and the reinforcing film.

7. The semiconductor package film of claim 6, wherein the reinforcing film includes a synthetic resin material.

8. The semiconductor package film of claim 1, wherein the support and the protective walls include copper.

9. A semiconductor package film having first and second edge areas and a main area which is disposed between the first and second edge areas, the semiconductor package film comprising:

a base film having first sprocket holes arranged in a first direction in the first edge area and second sprocket holes arranged in the first direction in the second edge area, the first and second edge areas being spaced apart from each other in a second direction intersecting the first direction;

a first support member disposed on the base film, the first support member being adjacent to the first sprocket holes in the first edge area; and a second support member disposed on the base film, the second support member being adjacent to the second sprocket holes in the second edge area, wherein the first support member includes a first support extending in the first direction and first protective walls connected to the first support, the first protective walls being spaced apart from each other with the first sprocket holes disposed between the first protective walls, wherein the first support member does not surround edges of the first sprocket holes adjacent to the main area, and the second support member includes a second support extending in the first direction and second protective walls connected to the second support, the second protective walls being spaced apart from each other with the second sprocket holes disposed between the second protective walls, wherein the second support member does not surround edges of the second sprocket holes adjacent to the main area.

10. The semiconductor package film of claim 1, wherein a width between protective walls adjacent to each other among the protective walls in the first direction is substantially equal to a width of one of the sprocket holes in the first direction.

* * * * *